(12) United States Patent
Wang

(10) Patent No.: US 11,995,339 B2
(45) Date of Patent: May 28, 2024

(54) FLASH MEMORY CHIP AND CALIBRATION METHOD AND APPARATUS THEREFOR

(71) Applicant: Hangzhou Zhicun (Witmem) Technology Co., Ltd., Hangzhou (CN)

(72) Inventor: Shaodi Wang, Beijing (CN)

(73) Assignee: Hangzhou Zhicun (Witmem) Technology Co., Ltd., Hangzhou (CN)

( * ) Notice: Subject to any disclaimer, the term of this patent is extended or adjusted under 35 U.S.C. 154(b) by 387 days.

(21) Appl. No.: 17/333,061

(22) Filed: May 28, 2021

(65) Prior Publication Data
US 2021/0303198 A1 Sep. 30, 2021

Related U.S. Application Data

(63) Continuation of application No. PCT/CN2019/081341, filed on Apr. 3, 2019.

(30) Foreign Application Priority Data

Nov. 28, 2018 (CN) .......................... 201811438979.5

(51) Int. Cl.
G06F 3/06 (2006.01)

(52) U.S. Cl.
CPC .......... *G06F 3/0655* (2013.01); *G06F 3/0604* (2013.01); *G06F 3/0679* (2013.01)

(58) Field of Classification Search
CPC .... G06F 3/0655; G06F 3/0604; G06F 3/0679; G11C 7/14; G11C 29/024; G11C 29/028; G11C 29/26; G11C 29/14

USPC ..................................................... 365/210.11
See application file for complete search history.

(56) References Cited

U.S. PATENT DOCUMENTS

| | | | |
|---|---|---|---|
| 2014/0035587 A1 | 2/2014 | Pascal et al. | |
| 2018/0293029 A1* | 10/2018 | Achtenberg | ......... G11C 29/028 |
| 2019/0018598 A1* | 1/2019 | Hung | ................... G06F 12/0246 |
| 2019/0227735 A1* | 7/2019 | Shaked | .................. G06F 3/0653 |

FOREIGN PATENT DOCUMENTS

| | | | |
|---|---|---|---|
| CN | 1336691 A | 2/2002 | |
| CN | 101060015 A | 10/2007 | |
| CN | 103811059 A | 5/2014 | |
| CN | 105785967 A | 7/2016 | |
| CN | 108804024 A * | 11/2018 | ............ G06F 11/073 |

* cited by examiner

*Primary Examiner* — Fernando Hidalgo
(74) *Attorney, Agent, or Firm* — Nitin Kaushik

(57) ABSTRACT

Disclosed are a flash memory chip and a calibration method and apparatus therefor. A working array in the flash memory chip can be calibrated by using adjustable weight level of flash memory units, specifically, at least one reference array used for calibrating the working array can be provided, and the number of flash memory units in the reference array is greater than or equal to the adjustable weight grades N of the flash memory units; initial weight values of the N flash memory units of the reference array correspond to N level of adjustable weights of the flash memory units on a one-to-one basis, and spare flash memory units are used as redundant units for standby application; thereby realizing off-line updating calibration for weights of the flash memory units in the working array compensating for the influence of electricity leakage on the weights of the flash memory units.

16 Claims, 15 Drawing Sheets

FLASH MEMORY CHIP AND CALIBRATION METHOD AND APPARATUS THEREFOR

CROSS REFERENCE TO RELATED APPLICATION

This application claims priority to Chinese Application No. 201811438979.5, filed on Nov. 28, 2018, entitled "FLASHMEMORY CHIP AND CALIBRATION METHOD AND APPARATUIS THEREFOR", which are hereby incorporated by reference in its entirety.

BACKGROUND

Flash memory chip is a long-life non-volatile memory chip, because it can still save data when power is off, flash memory is usually used to save setting information, such as saving data in the BIOS (basic program) of the computer, PDA (personal digital assistant), digital camera, etc., which is widely used.

However, as the use time of flash memory chips increases, the flash memory units (i.e., flash memory transistors) are leaking, because the weight of the flash memory units (i.e., the data stored in the flash memory transistors) is related to the number of electrons stored in the flash memory units. Leakage will cause the number of electrons in the flash memory unit to decrease, that is, the weight of the flash memory unit (that is, the data stored in the flash memory transistor) will be changed, which reduces the accuracy of the stored data.

SUMMARY

In view of this, the present disclosure provides a flash memory chip and a calibration method, apparatus, device and medium thereof, which can solve the problem of reduced accuracy of stored data caused by leakage.

In order to solve the above technical problems, the present disclosure adopts the following technical solutions:

In a first aspect, a flash memory chip is provided, which comprising: a working array and at least one reference array for calibrating the working array;

both the working array and the reference array are composed of a plurality of flash memory units with an adjustable weight level of N, and the flash memory units have N levels of adjustable weight;

the number of flash memory units in the reference array is greater than or equal to the adjustable weight level N;

the initial weight values of the N flash memory units of the reference array correspond one-to-one with the N-level adjustable weights.

Further, the flash memory chip also comprising: a reading circuit, the reading circuit is connected to the working array and the reference array, and is used to read the weight values of the flash memory units in the working array and the reference array.

Further, the flash memory chip also comprising: a programming circuit, the programming circuit is connected to the working array and the reference array, and is used to control the weight values of the flash memory units in the working array and the reference array.

Further, the flash memory chip also comprising: a row and column decoder, the row and column decoder is connected to the working array and the reference array, and is used to select the flash memory units in the working array and the reference array.

Further, the flash memory chip also comprising: a controller, the controller is connected to the reading circuit, the programming circuit and the row and column decoder, and is used for controlling the operation of the reading circuit, the programming circuit and the row and column decoder.

In a second aspect, a method for calibrating a flash memory chip is provided for the above flash memory chip, and the method for calibrating a flash memory chip comprising:

setting the initial weight value of the flash memory unit in the reference array according to the adjustable weight of the flash memory unit;

calibrating the real-time weight value of the flash memory unit in the working array according to the real-time weight value and the initial weight value of the flash memory unit in the reference array.

Further, the step of setting the initial weight value of the flash memory unit in the reference array according to the adjustable weight of the flash memory unit comprising: setting the initial weight value of each flash memory unit in N flash memory units of the reference array to be equal to one of the N-level adjustable weight, so that the initial weight value of the N flash memory units corresponds one-to-one with a N-level adjustable weight.

Further, the step of calibrating the real-time weight value of the flash memory unit in the working array according to the real-time weight value and the initial weight value of the flash memory unit in the reference array comprising:

obtaining the calibration target weight value according to the real-time weight value of the flash memory unit in the reference array;

reading the real-time weight values of the flash memory units in the working array sequentially;

calibrating the real-time weight values of the flash memory units in the working array sequentially according to the initial weight values of the N flash memory units in the reference array and the calibration target weight values.

Further, the step of calibrating the real-time weight values of the flash memory units in the working array sequentially according to the initial weight values of the N flash memory units in the reference array and the calibration target weight values comprising:

searching the reference array for a flash memory unit whose calibration target weight value is equal to or similar to a real-time weight value of a flash memory unit in the working array;

setting the real-time weight value of the flash memory unit in the working array to an initial weight value of the found flash memory unit in the reference array.

Further, obtaining the calibration target weight value according to the real-time weight value of the flash memory unit in the reference array comprising:

reading the real-time weight value of the flash memory unit in the reference array;

using the read real-time weight value of the flash memory unit as the calibration target weight value of the flash memory unit, when the number of the reference array is 1;

calculating the average value of the real-time weight values of the flash memory units with the same initial weight value in all the reference arrays as the calibration target weight value of the flash memory unit, when the number of the reference array is greater than 1.

In a third aspect, a flash memory chip calibration device is provided for use in the above flash memory chip, and the flash memory chip calibration device comprising:

an initialization module, which setting the initial weight value of the flash memory unit in the reference array according to the adjustable weight of the flash memory unit;

a first calibration module, which calibrating the real-time weight value of the flash memory unit in the working array according to the real-time weight value and the initial weight value of the flash memory unit in the reference array.

Further, the initialization module comprising:

an initial weight setting unit, which setting the initial weight value of each flash memory unit in N flash memory units of the reference array to be equal to one of the N-level adjustable weight, so that the initial weight value of the N flash memory units corresponds one-to-one with a N-level adjustable weight.

Further, the first calibration module comprising:

an obtaining unit, which obtaining the calibration target weight value according to the real-time weight value of the flash memory unit in the reference array;

a reading unit, which reading the real-time weight values of the flash memory units in the working array sequentially a calibration unit, which calibrating the real-time weight values of the flash memory units in the working array sequentially according to the initial weight values of the N flash memory units in the reference array and the calibration target weight values.

In a fourth aspect, a method for calibrating a flash memory chip is provided, which comprising:

reading the real-time weight value of the flash memory unit in the working array;

calibrating the real-time weight value of the flash memory unit in the working array according to the adjustable weight level table.

Further, the step of calibrating the real-time weight value of the flash memory unit in the working array according to the adjustable weight level table comprising:

searching the adjustable weight level table for an adjustable weight value that is equal to or similar to the real-time weight value of the flash memory unit;

setting the real-time weight value of the flash memory unit to the adjustable weight value.

In a fifth aspect, a flash memory chip calibration device is provided, which comprising:

a reading module, which reading the real-time weight value of flash memory units in the working array;

a second calibration module, which calibrating the real-time weight value of the flash memory unit in the working array according to the adjustable weight level table.

In a sixth aspect, a computer device is provided, which comprising a memory, a processor, and a computer program stored on the memory and running on the processor, wherein the processor executes the above-mentioned steps of the flash chip calibration method when the program is executed.

In a seventh aspect, there is provided a computer-readable storage medium on which a computer program is stored, wherein the computer program is characterized in that, when the computer program is executed by a processor, the steps of the above flash memory chip calibration method are executed.

The present disclosure disclosed a flash memory chip and its calibration method, device, apparatus and medium. The adjustable weight level of the flash memory unit can be used to calibrate the working array in the flash memory chip. Specifically, at least one reference array for calibrating the working array can be set, and the number of flash memory units in the reference array is greater than or equal to the adjustable weight level N of the flash memory units; the initial weight values of the N flash memory units of the reference array correspond one-to-one with the N-level adjustable weights of the flash memory units, the redundant flash memory unit serves as a redundant unit as a backup; during calibration, the real-time weight value of the flash memory unit in the working array is calibrated according to the real-time weight value and the initial weight value of the flash memory unit in the reference array. In this way, the off-line updating calibration of the weight of the flash memory units in the working array is realized. The effect of leakage phenomenon on the weight of flash memory units is compensated, which improving the accuracy of stored data.

In order to make the above and other objects, features and advantages of the present disclosure more comprehensible, preferred embodiments are described in detail below in conjunction with the accompanying drawings.

BRIEF DESCRIPTION OF THE DRAWINGS

In order to more clearly describe the technical solutions in the embodiments of the present application or the prior art, the embodiments will be more readily understood in view of the following description. Obviously, the drawings in the following description are some embodiments of the present application. For those of ordinary skill in the art, other drawings can be obtained based on these drawings without creative work, wherein.

DETAILED DESCRIPTION

In order to enable those skilled in the art to better understand the solutions of the present application, the technical solutions in the embodiments of the present application will be described clearly and completely in conjunction with the accompanying drawings in the embodiments of the present application. Obviously, the described embodiments are only a part of the embodiments of the present application, rather than all the embodiments. Based on the embodiments in this application, all other embodiments obtained by those of ordinary skill in the art without creative work should fall within the protection scope of this application.

It should be noted that the embodiments in this application and the features in the embodiments can be combined with each other if there is no conflict. Hereinafter, the present application will be described in detail with reference to the drawings and in conjunction with the embodiments.

As the use time of flash memory chips increases, the flash memory units (i.e., flash memory transistors) are leaking, which reduces the accuracy of storing data. In order to solve this problem, the applicant has conducted a lot of research and experiments and found that for the same flash memory chip, all flash memory units have the same leakage trend. By using this discovery, embodiments of the present disclosure provide a flash memory chip and a calibration method, device, apparatus, and medium thereof, which realizing an off-line updating calibration of the weight of the flash memory unit in the working array, compensating the influence of the leakage phenomenon on the weight of the flash memory unit, and improving the accuracy of the stored data.

Figure 1:
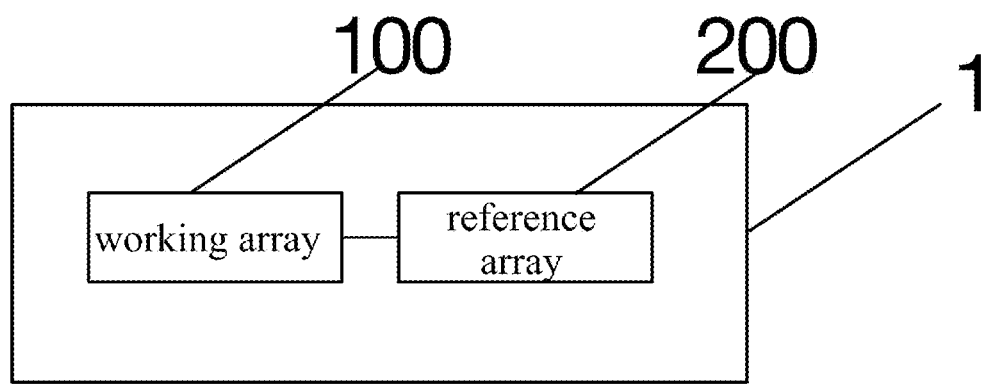
FIG. 1 is a first structural block diagram of a flash memory chip according to an embodiment of the present disclosure.

FIG. 1 is a first structural block diagram of a flash memory chip according to an embodiment of the present disclosure. As shown in FIG. 1, the flash memory chip 1 includes a working array 100 and at least one reference array 200 for calibrating the working array 100, and the working array 100 is connected to the reference array 200.

Specifically, both the working array 100 and the reference array 200 are composed of a plurality of flash memory units, wherein, the flash memory unit is the smallest unit constituting the flash memory chip, and the adjustable weight level of the flash memory unit is N, that is, the flash memory unit has N levels of adjustable weight.

In an alternative embodiment, the flash memory unit may be a flash memory transistor, such as SONOS floating-gate transistor, Split-gate floating-gate transistor or Charge-trapping floating-gate transistor. The embodiments of the present disclosure include but are not limited to those types of transistor.

The number of flash memory units in the reference array is greater than or equal to the adjustable weight level N of the flash memory units. In addition, the initial weight values of the N flash memory units in the reference array correspond one-to-one with the N-level adjustable weights, and the remaining flash memory units are used as redundant units for backup.

It should be noted that all flash memory units in the flash memory chip have the same model. When storing data, the storage of different data is realized by adjusting the weight of the flash memory unit. However, the weight of the flash memory unit cannot be adjusted to any value at will, but the flash memory unit has multi-level adjustable weights. Data storage is realized by adjusting the weight of the flash memory unit to the corresponding adjustable weight.

For example, in a flash memory chip, the adjustable weight of the flash memory unit can have N values, which are denoted as A1~AN, N is the adjustable weight level, A1 is the 1st level adjustable weight, and AN is the Nth level adjustable weight.

Because for the same flash memory chip, all flash memory units have the same leakage trend, so after a certain period of time, the working array and the reference array have the same leakage trend, that is, the weight shift is the same. At this time, the reference array is used to calibrate the weight of the working array.

Specifically, when the number of reference arrays is 1, the read real-time weight value of the flash memory unit is used as the calibration target weight value of the flash memory unit. When the number of the reference arrays is greater than 1, the average value of the real-time weight values of the flash memory units with the same initial weight value in all the reference arrays is calculated as the calibration target weight value of the flash memory unit; then, reading the real-time weight values of the flash memory units in the working array in sequence; and then, searching the reference array for a flash memory unit whose calibration target weight value is equal to or similar to the real-time weight value of a flash memory unit in the working array; finally, setting the real-time weight value of the flash memory unit in the working array to the initial weight value of the found flash memory unit in the reference array.

For example, the initial weight value of the Kth flash memory unit in the reference array is set to $A_K$. After a certain period of time, the weight value should still be $A_K$. However, due to leakage, its weight value becomes $A_V$. Then the updating of the Kth flash memory unit at this time is $(A_K-A_V)$. At this time, the flash memory units with the weight value $A_V$ in the working array also have the electricity leakage of $(A_K-A_V)$. Then, the weight value of the flash memory unit with the weight value of $A_V$ in the working array is set to $A_K$ to compensate for the leakage.

It should be noted that if the real-time weight value of a flash memory unit in the working array is $A_i$, and there is no flash memory unit whose calibration target weight value is equal to $A_i$ in the reference array, at this time, searching the reference array for flash memory units whose calibration target weight value is similar to $A_i$, such as $A_{V-1}<A_i<A_V$. At this time, the flash memory units with the calibration target weight value of $A_{V-1}$ and the calibration target weight value of $A_V$ in the reference array are used to calibrate the flash memory units with the real-time weight value $A_i$ in the working array. Specifically, if $A_i$ is closer to $A_V$, adjust the real-time weight value of the flash memory unit whose real-time weight value is $A_i$ in the working array to the initial weight value of the flash memory unit whose calibration target weight value is $A_V$ in the reference array. If $A_i$ is closer to $A_{V-1}$, the real-time weight value of the flash memory unit with the real-time weight value $A_i$ in the working array is adjusted to the initial weight value of the flash memory unit with the calibration target weight value of $A_{V-1}$ in the reference array. If $A_i$ is exactly between $A_{V-1}$ and $A_V$, one of the flash memory units with the calibration target weight value of $A_{V-1}$ or the calibration target weight value of $A_V$ in the reference array is used to calibrate the flash memory units with the real-time weight value $A_i$ in the working array.

Of course, in the same flash chip. When the real-time weight value $A_i$ of the flash memory unit of the working array is in the middle of the calibration target weight value of the two flash memory units in the reference array, if the flash memory unit in the calibration working array with a larger calibration target weight value is used, all flash memory units in the flash memory chip adopt this rule, and vice versa.

In summary, the embodiment of the present disclosure sets at least one reference array for calibrating the working array, and uses the reference array to calibrate the weight of the working array. The off-line updating calibration of the weight of the flash memory unit in the working array is realized, which compensates the influence of the leakage phenomenon on the weight of the flash memory unit, and can improve the accuracy of the stored data.

In an alternative embodiment, a part of the working array of the flash memory chip 1 may be used as a reference array to form the working array 100 and the reference array 200.

Figure 2:
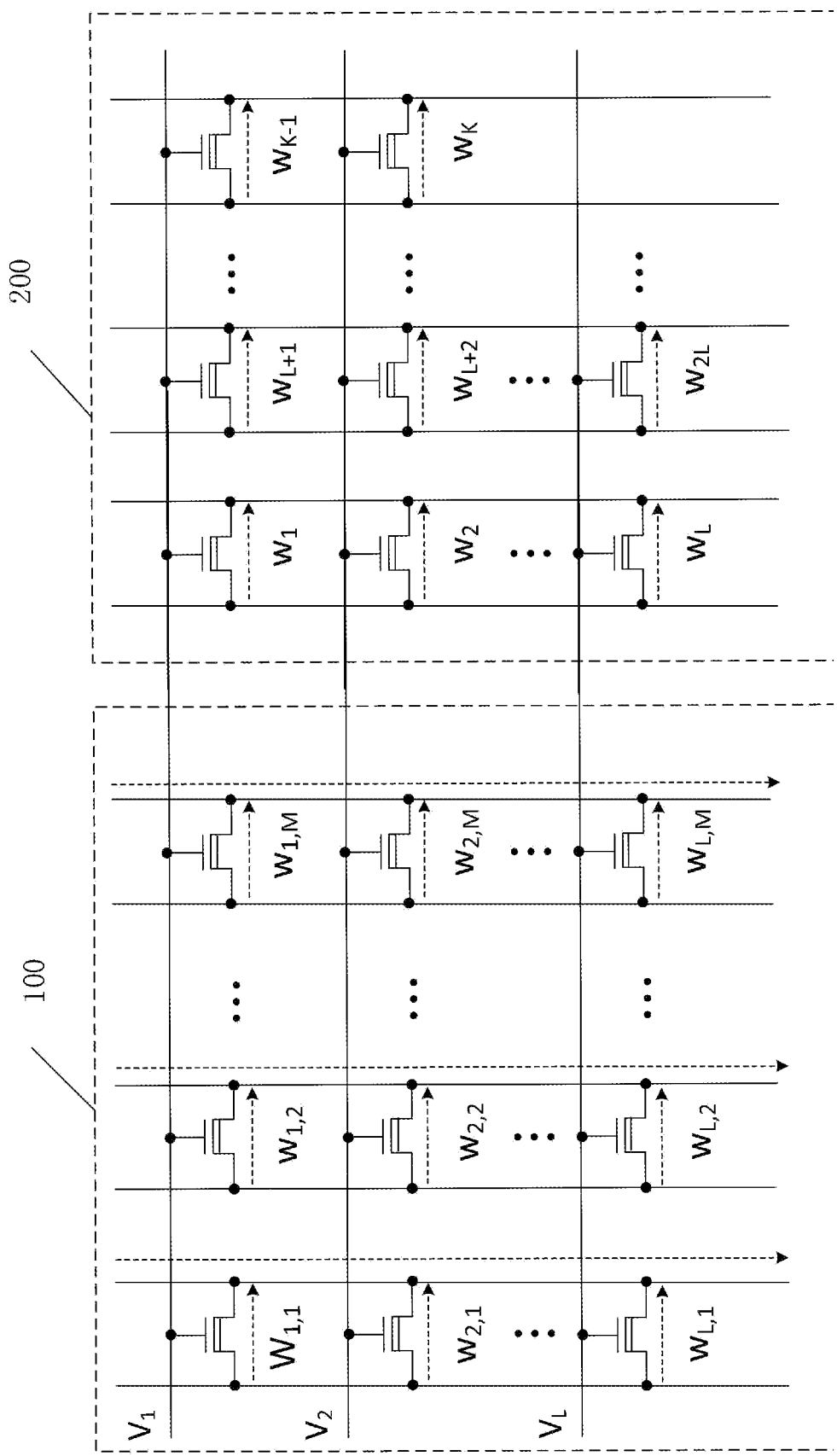
FIG. 2 is a first schematic circuit diagram of a flash memory chip according to an embodiment of the present disclosure.

For example, FIG. 2 shows that a reference array 200 is divided on the right side of a working array of a flash memory chip to form an M×N working array 100 and a reference array 200. Limited by the number of flash memory units in the reference array 200, the flash memory units in the reference array 200 may be arranged in a complete array, or may be arranged in an array form in which flash memory units are not arranged in some positions. The location where the flash memory unit is not set can be selected arbitrarily. Of course, it is also possible to divide a reference array 200 on the left side of the working array of the flash memory chip to form an M×L working array 100 and a reference array 200. The principle is the same as dividing the reference array on the right side of the working array of the flash memory chip.

Figure 3:
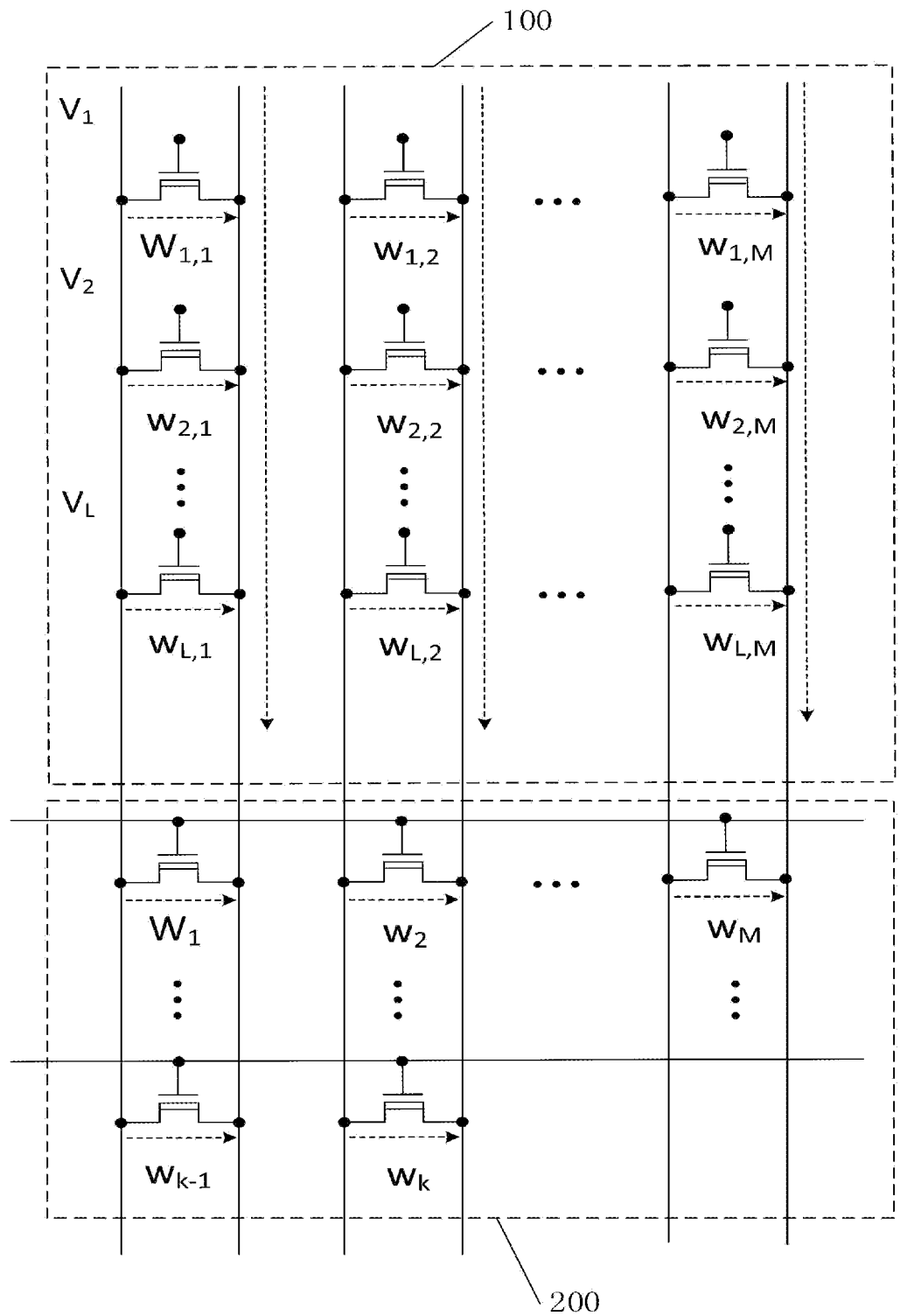
FIG. 3 is a second schematic circuit diagram of a circuit of a flash memory chip according to an embodiment of the present disclosure.

For example, FIG. 3 shows that a reference array 200 is divided above the working array of a flash memory chip to form an M×L working array 100 and a reference array 200. Limited by the number of flash memory units in the reference array 200, the flash memory units in the reference array 200 may be arranged in a complete array, or may be arranged in an array form in which flash memory units are not arranged in some positions. The location where the flash memory unit is not set can be selected arbitrarily. Of course, a reference array 200 can also be divided under the working array of the flash memory chip to form an M×L working array 100 and a reference array 200. The principle is the same as that of dividing the reference array above the working array of the flash memory chip, which can be referred to each other and will not be repeated here.

For example, FIG. 3 shows that a reference array 200 is divided above the working array of a flash memory chip to form an M×L working array 100 and a reference array 200. Limited by the number of flash memory units in the reference array 200, the flash memory units in the reference array 200 may be arranged in a complete array, or may be arranged in an array form without flash memory units in some positions. The location where the flash memory unit is not set can be selected arbitrarily. Of course, a reference array 200 can also be divided under the working array of the flash memory chip to form an M×L working array 100 and a reference array 200. The principle is the same as dividing the reference array above the working array of the flash memory chip, and will not be repeated here.

Figure 4:
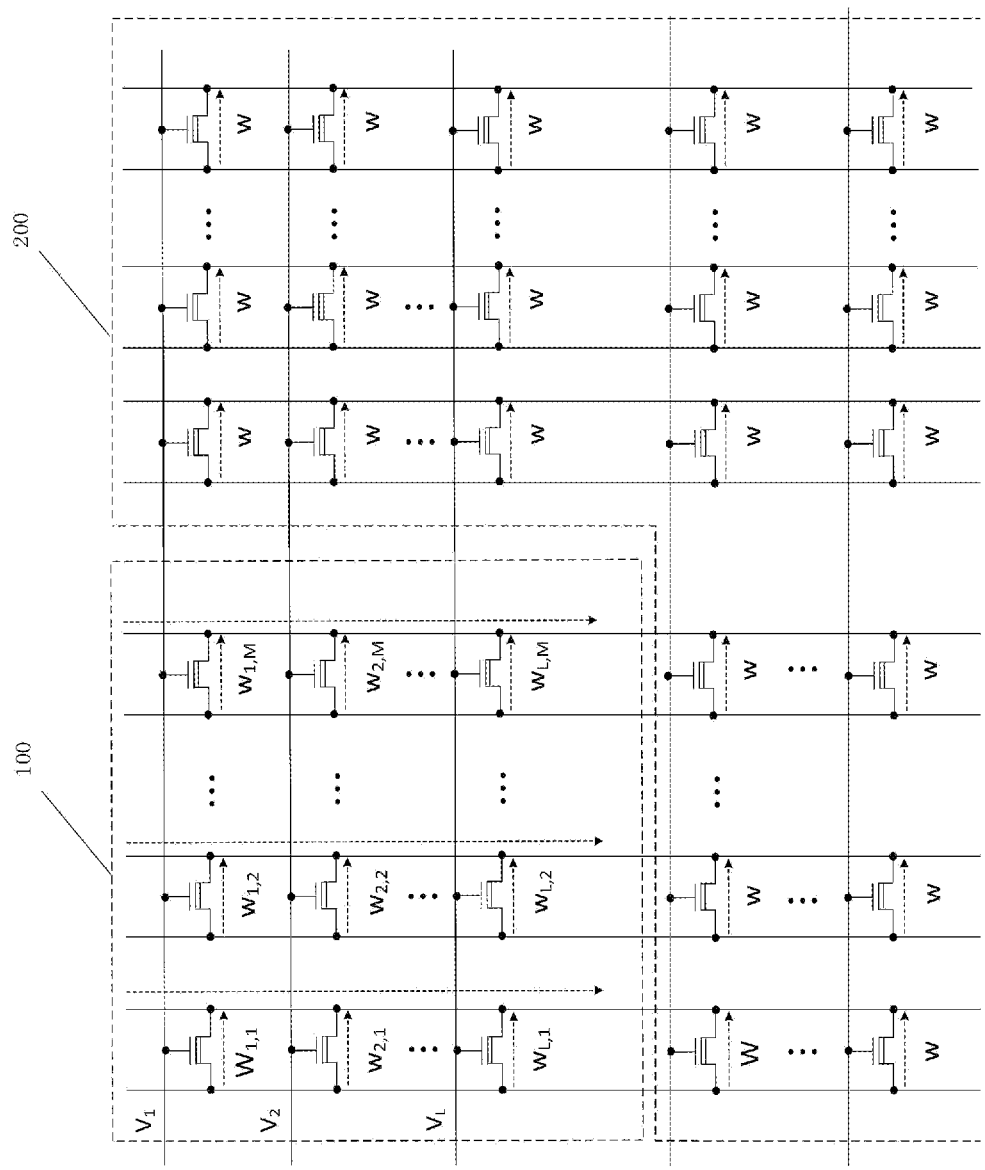
FIG. 4 is a third schematic circuit diagram of a flash memory chip according to an embodiment of the present disclosure.

For example, FIG. 4 shows that a reference array 200 is divided on the right and below the working array of a flash memory chip to form an M×L working array 100 and a reference array 200. Limited by the number of flash memory units in the reference array 200, the flash memory units in the reference array 200 may be arranged in a complete array, or may be arranged in an array form without flash memory units in some positions. The location where the flash memory unit is not set can be selected arbitrarily. Of course, a reference array 200 can also be divided on the right and above or the left and above or the left and below of the working array of the flash memory chip to form an M×L working array 100 and reference array 200. The principle is the same as dividing the reference array on the right and below the working array of the flash memory chip, and will not be repeated here.

Figure 5:
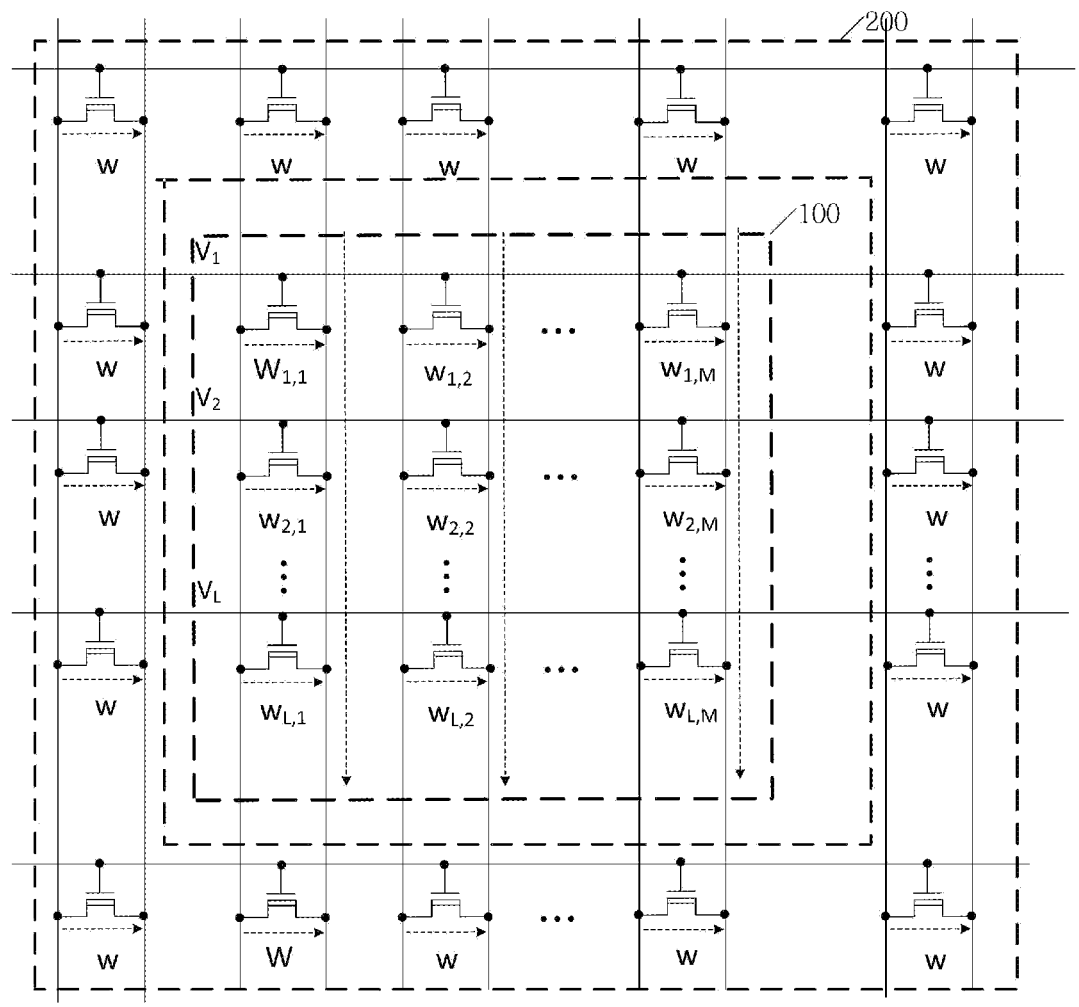
FIG. 5 is a fourth schematic circuit diagram of a flash memory chip according to an embodiment of the present disclosure.

For example, FIG. 5 shows that a reference array 200 is divided around a working array of a flash memory chip to form an M×L working array 100 and a reference array 200. Limited by the number of flash memory units in the reference array 200, the flash memory units in the reference array 200 may be completely arranged in one or more circles around the working array, or may be arranged only part of a circle or multiple circles around the working array. The location where the flash memory unit is not set can be selected arbitrarily.

It can be known from the above examples that a part of the working array of the flash memory chip can be used as a reference array. A specific division method can be selected according to actual needs, and the number of flash memory units greater than or equal to the weight level of the flash memory unit can be selected as the reference array on the top, bottom, left, and right of the working array. The embodiment of the present disclosure does not limit the division manner.

Those skilled in the art can understand that the reference array can also be independently set in a flash memory chip, which is independent of the working array in the flash memory chip. When the flash memory chip is working, both the reference array and the working array are excited, so the weight of the independent reference array can also be used to calibrate the weight of the working array.

Of course, those skilled in the art can also understand that the reference array and the working array on the same flash memory chip can experience the same excitation or different excitations.

In a preferred embodiment, the flash memory chip is provided with a plurality of reference arrays as described above, and the number of flash memory units in each reference array is greater than or equal to the adjustable weight level of the flash memory units. The initial weight values of the N flash memory units of each reference array correspond to the N-level adjustable weights of the flash memory units in a one-to-one correspondence. Before calibrating the working array with the reference array, the average value of the real-time weight values of the flash memory units corresponding to the same level of adjustable weights in the multiple reference arrays is calculated as the calibration target weight value of the flash memory unit. The calibration target weight value of the flash memory unit is used to calibrate the working array.

Considering that different flash memory units are due to process deviations or spatial distributions and different external environments, although the leakage trends of flash memory units on the same flash memory chip are the same, the leakage power may not be exactly the same. That is, the weight shifts are similar but not exactly the same. When the weight of the reference array is used to calibrate the weight of the working array, only part of the leakage effect can be compensated, and the leakage effect cannot be completely eliminated. At this time, using the weight average of the flash memory units corresponding to the same level of weight in the multiple reference arrays to calibrate the working array can effectively take into account the weight shifts of different flash memory units, and thus can eliminate the effect of leakage to the greatest extent.

Figure 6:
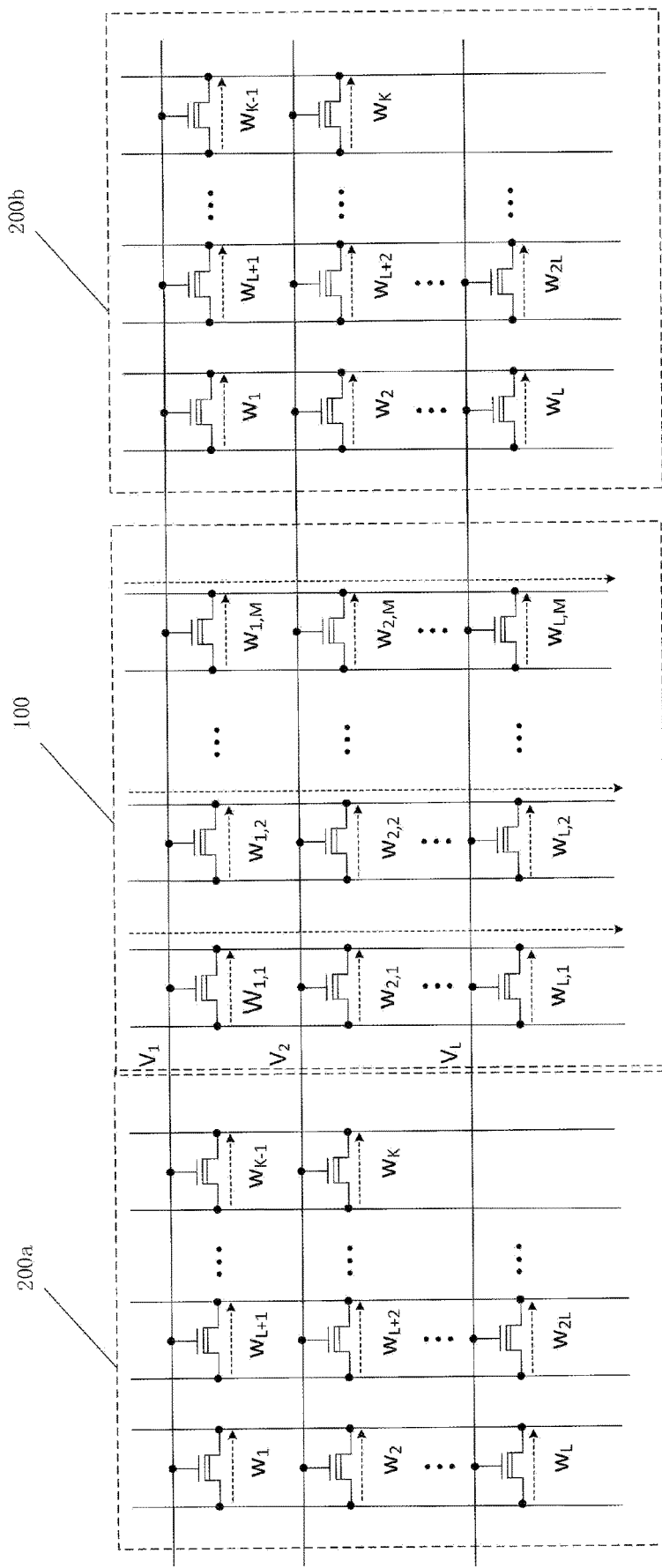
FIG. 6 is a fifth schematic circuit diagram of a flash memory chip according to an embodiment of the present disclosure.
Figure 7:
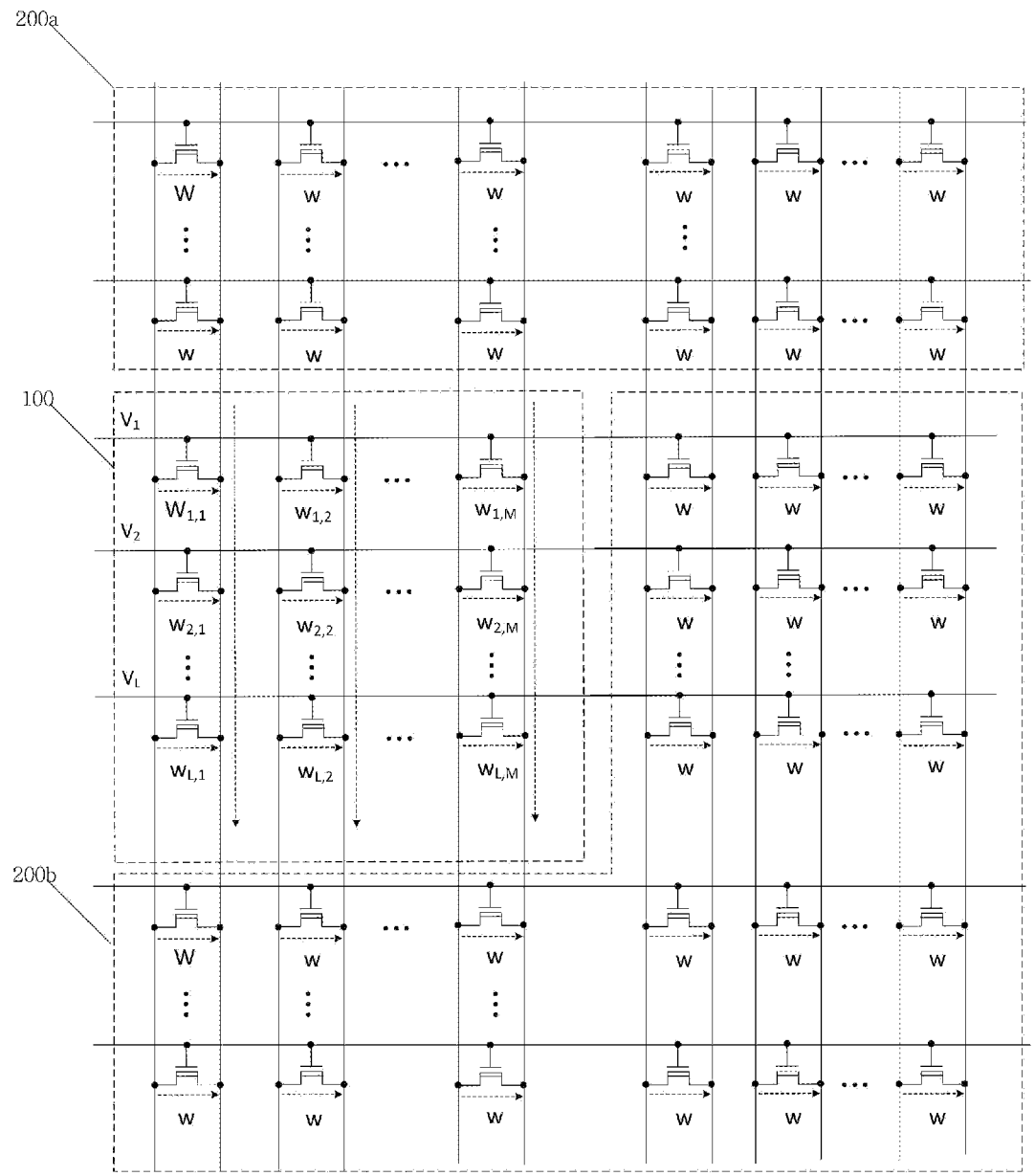
FIG. 7 is a sixth schematic circuit diagram of a flash memory chip according to an embodiment of the present disclosure.
Figure 8:
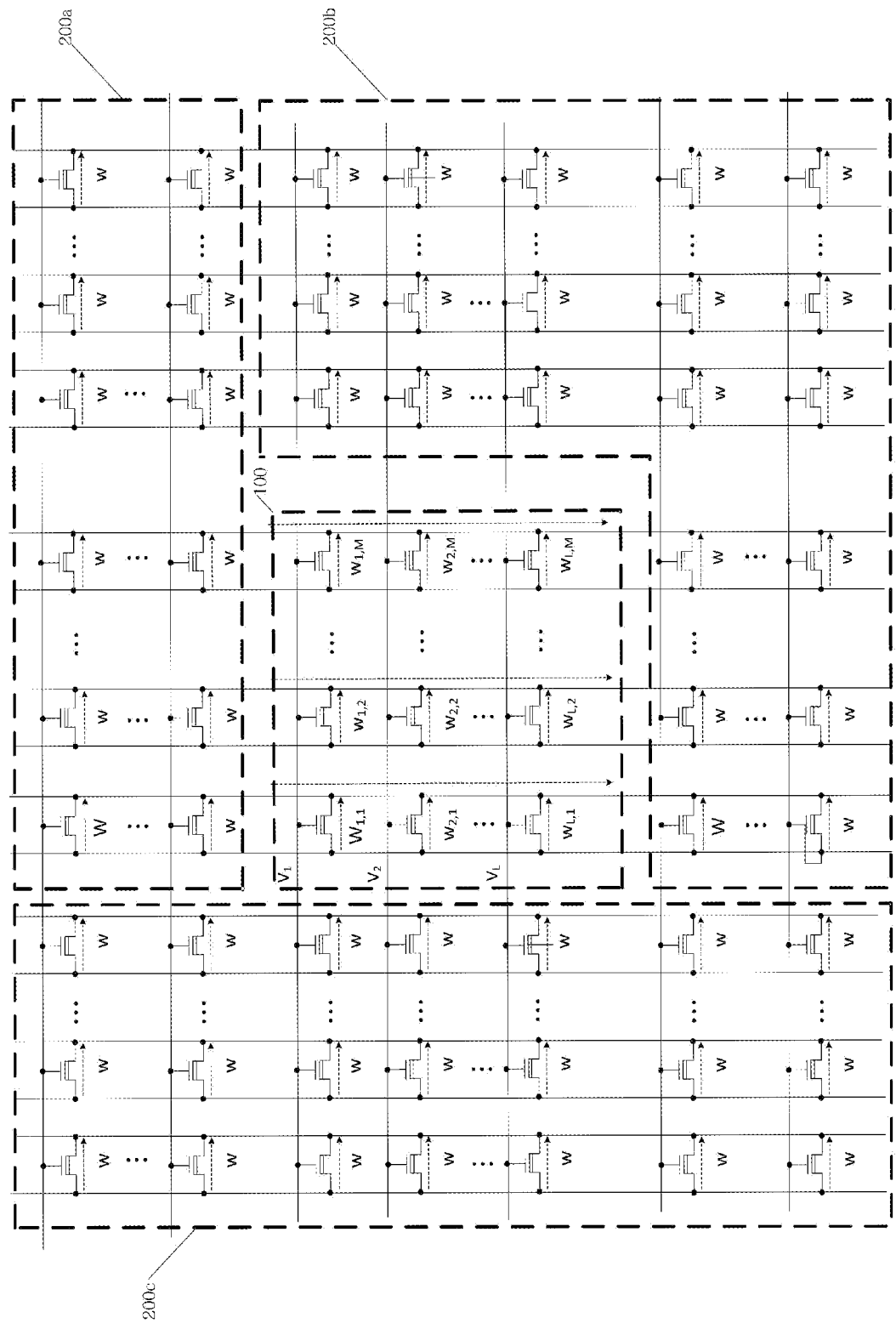
FIG. 8 is a seventh circuit diagram of a flash memory chip according to an embodiment of the present disclosure.

Specifically, the multiple reference arrays may include: setting reference arrays to the up, down, left, and right of the working array (FIG. 6 shows that the reference array 200a and the reference array 200b are respectively provided on the left and right sides of the working array 100); setting the reference arrays to the right and below the working array; setting the reference arrays to the right and above the working array; setting the reference arrays to the left and above the working array; setting the reference array to the left and below the working array; setting a reference array around the working array or a combination of the former (FIG. 7 shows that reference arrays 200a and 200b are arranged above, right and below the working array 100; FIG. 8 adds a reference array 200c to the left of the working array 100 on the basis of FIG. 7). The embodiment of the present disclosure does not limit the placement positions of the multiple reference arrays, and only requires that the number of flash memory units in each reference array is greater than or equal to the weight level of the flash memory units. The weight values of part of the flash memory units correspond one-to-one with the weight values of the multi-level weights, and the redundant flash memory units can be used as redundant units for backup. For the specific setting method of each reference array, please refer to the above description, which will not be repeated here.

Figure 9:
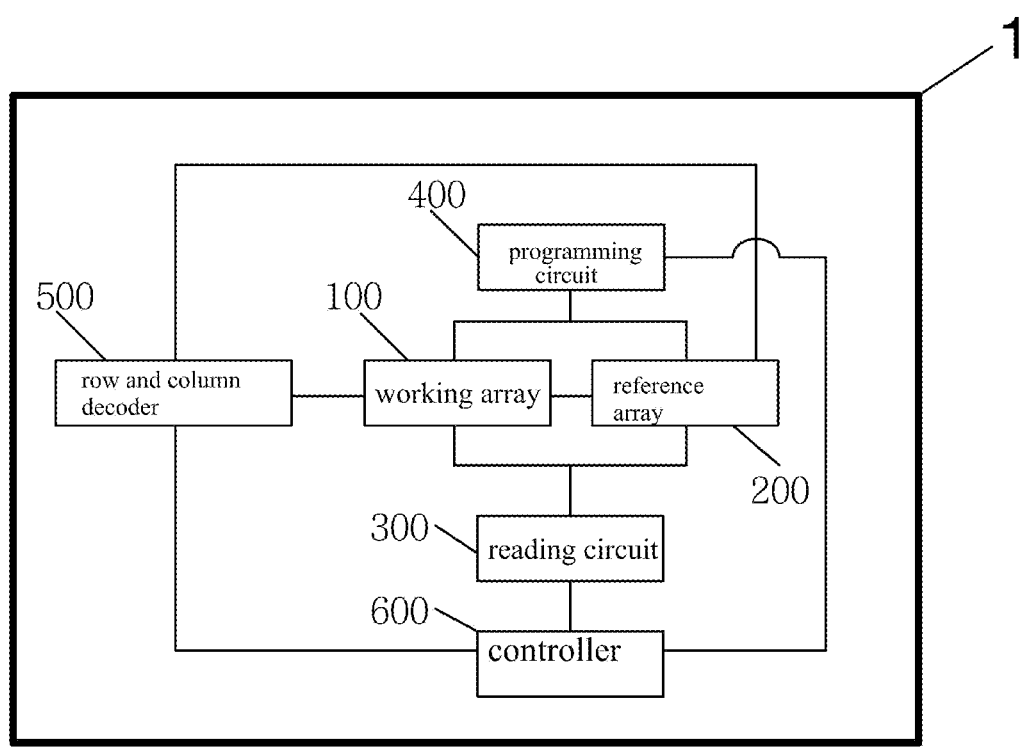
FIG. 9 is a second structural block diagram of a flash memory chip according to an embodiment of the present disclosure.

FIG. 9 is a second structural block diagram of a flash memory chip according to an embodiment of the present disclosure. As shown in FIG. 9, the flash memory chip is based on the flash memory chip described in any one of FIGS. 1 to 8. It also includes: a reading circuit 300, a programming circuit 400, a row and column decoder 500, and a controller 600.

The reading circuit 300 is connected to the working array 100 and the reference array 200 for reading the weight values of the flash memory units in the working array 100 and the reference array 200.

Specifically, the reading circuit 300 is connected to each flash memory unit in the working array 100 and the reference array 200, and under the control of the controller 600, the weight value of the flash memory unit is read.

The programming circuit 400 is connected to the working array 100 and the reference array 200 for controlling the weight values of the flash memory units in the working array 100 and the reference array 200.

Specifically, the programming circuit 400 is connected to each flash memory unit in the working array 100 and the reference array 200 to generate a programming voltage or an erase voltage and apply it to the flash memory unit to adjust the weight value of the flash memory unit.

The row and column decoder 500 is connected to the working array 100 and the reference array 200, and is used to select the flash memory units in the working array 100 and the reference array 200.

Specifically, the row and column decoder 500 is connected to each flash memory unit in the working array 100 and the reference array 200, and under the control of the controller 600, the required flash memory unit is selected.

The controller 600 is connected to the reading circuit 300, the programming circuit 400, and the row and column decoder 500, and is used to control the operation of the reading circuit 300, the programming circuit 400, and the row and column decoder 500.

Figure 10:
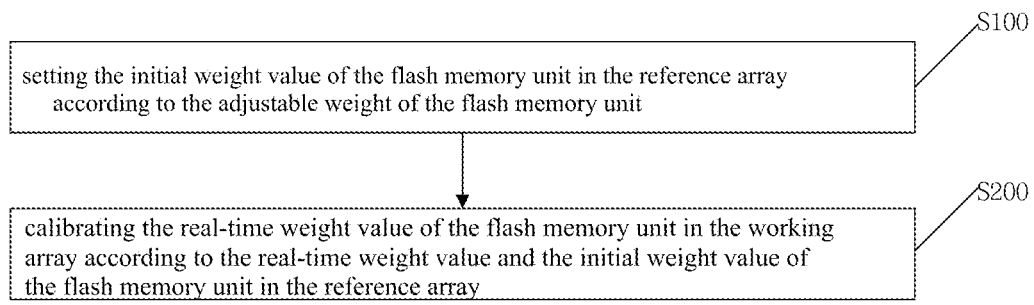
FIG. 10 is a flowchart of a method for calibrating a flash memory chip according to an embodiment of the present disclosure.

The embodiment of the present disclosure also provides a method for calibrating a flash memory chip, as shown in FIG. 10, which is used for the above flash memory chip and includes:

step S100: setting the initial weight value of the flash memory unit in the reference array according to the adjustable weight of the flash memory unit.

The reference array of the flash memory chip is used to calibrate the working array in the flash memory chip. There is at least one reference array, and both the working array and the reference array are composed of a plurality of flash memory units with an adjustable weight level of N, that is, the flash memory units have N Level adjustable weight. The number of flash memory units in the reference array is greater than or equal to the adjustable weight level N. In addition, the flash memory chip further includes a reading circuit for reading the weight values of the flash memory units in the working array and the reference array; a programming circuit for controlling the weight value of the flash memory units in the working array and the reference array; a row and column decoders for selecting the working array and the flash memory units in the reference array; and a controller for the reading circuit, the programming circuit and the row and column decoder.

Specifically, the row and column decoder and the programming circuit cooperate to perform initial weight value setting, the row and column decoder selects the flash memory units to be programmed, and the programming circuit programs the flash memory units selected by the row and column decoder. The initial weight value of each flash memory unit in the N flash memory units of the reference array is set to be equal to one of the N-level adjustable weight. The initial weight values of the N flash memory units are equal to the N-level adjustable weights in a one-to-one correspondence, and the remaining flash memory units are used as redundant units for backup.

Specifically, for an M×L working array, the adjustable weight value of each flash memory unit may have N values, which are denoted as $A_1$-$A_N$. N is the weight level, $A_1$ is the adjustable weight value corresponding to the first level weight, and AN is the adjustable weight value corresponding to the N level weight.

In the reference array of the flash memory chip, N flash memory units are selected for calibrating the working array, and the remaining flash memory units are used as redundant units for backup. The controller controls the row and column decoders and the programming circuit to cooperate to set the weight values of the N flash memory units to $A_1$-$A_N$, respectively.

Step S200: Calibrating the real-time weight value of the flash memory unit in the working array according to the real-time weight value and the initial weight value of the flash memory unit in the reference array.

After a certain period of time, the flash memory unit has leakage, and both the working array and the reference array have the same leakage trend, that is, the weight shift is the same. At this time, the reference array is used to calibrate the weight of the working array to compensate for the leakage. The controller controls the reading circuit, the row and column decoder, and the programming circuit to coordinate, and calibrate the real-time weight value of the flash memory unit in the working array according to the real-time weight value and the initial weight value of the flash memory unit in the reference array.

Figure 11:
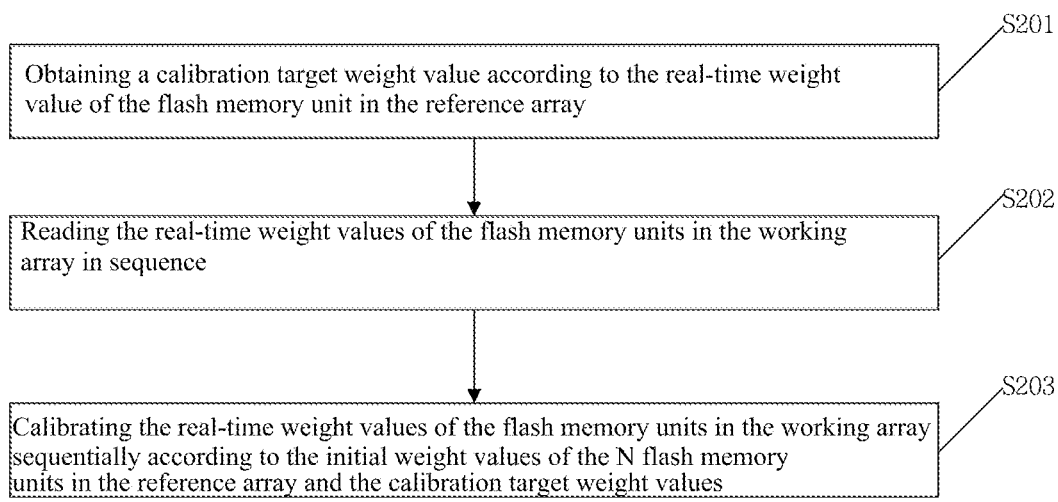
FIG. 11 shows the specific steps of step S200 in FIG. 10.

Specifically, this step S200 includes the following steps (as shown in FIG. 11):

Step S201: Obtaining a calibration target weight value according to the real-time weight value of the flash memory unit in the reference array.

Specifically: the read circuit is used to read the real-time weight value of the flash memory unit in the reference array. When the number of reference arrays is 1, the real-time weight value of the read flash memory unit is used as the calibration target weight value of the flash memory unit. When the number of the reference arrays is greater than 1, the average value of the real-time weight values of the flash memory units with the same initial weight value in all the reference arrays is calculated as the calibration target weight value of the flash memory unit.

Step S202: Reading the real-time weight values of the flash memory units in the working array in sequence.

Step S203: Calibrating the real-time weight values of the flash memory units in the working array sequentially according to the initial weight values of the N flash memory units in the reference array and the calibration target weight values.

Specifically, the reference array is searched for a flash memory unit whose calibration target weight value is equal to or similar to the real-time weight value of a flash memory unit in the working array. Then, the real-time weight value of the flash memory unit in the working array is set to the initial weight value of the found flash memory unit in the reference array.

For example: the initial weight value of the Kth flash memory unit in the reference array is set to $A_K$. After a certain period of time, the weight value should still be $A_K$, but due to leakage, its weight value becomes $A_V$. Then the electricity leakage of the Kth flash memory unit at this time is $(A_K-A_V)$. At this time, the flash memory units with the weight value of $A_V$ in the working array also have the electricity leakage of $(A_K-A_V)$, and the weight value of the flash memory units with the weight value of $A_V$ in the working array is set to $A_K$ to compensate for the leakage.

It should be noted that if the real-time weight value of a flash memory unit in the working array is $A_i$, and there is no flash memory unit whose calibration target weight value is equal to $A_i$ in the reference array. At this time, searching the reference array for flash memory units whose calibration target weight value is similar to $A_i$, such as $A_{V-1} < A_i < A_v$. At this time, the flash memory units with the calibration target weight value $A_{V-1}$ and the calibration target weight value $A_v$ in the reference array are used to calibrate the flash memory units with the real-time weight value $A_i$ in the working array. Specifically, if $A_i$ is closer to $A_v$, adjust the real-time weight value of the flash memory unit whose real-time weight value is $A_i$ in the working array to the initial weight value of the flash memory unit whose calibration target weight value is $A_v$ in the reference array. If $A_i$ is closer to $A_{V-1}$, adjusting the real-time weight value of the flash memory unit whose real-time weight value is $A_i$ in the working array to the initial weight value of the flash memory unit whose calibration target weight value is $A_{v-1}$ in the reference array. If $A_i$ is exactly between $A_{V-1}$ and $A_v$, one of the flash memory units with the calibration target weight value $A_{V-1}$ or the calibration target weight value $A_v$ in the reference array is used to calibrate the flash memory unit with the real-time weight value $A_i$ in the working array.

Of course, in the same flash memory chip, when the real-time weight value $A_i$ of the flash memory unit of the working array is located in the middle of the calibration target weight value of the two flash memory units in the reference array, if the flash memory unit in the calibration working array with a larger calibration target weight value is used, all flash memory units in the flash memory chip adopt this rule, and vice versa.

In summary, the flash memory chip calibration method provided by the embodiment of the present disclosure sets at least one reference array for calibrating the working array, and the number of flash memory units in the reference array is greater than or equal to the adjustable weight level N of the flash memory units. The initial weight values of the N flash memory units of the reference array correspond one-to-one with the N-level adjustable weights of the flash memory units, and the redundant flash memory units are used as redundant cells for backup. During calibration, the real-time weight value of the flash memory unit in the working array is calibrated according to the real-time weight value and the initial weight value of the flash memory unit in the reference array. In this way, the off-line updating calibration of the weight of the flash memory unit in the working array is realized, the influence of the leakage phenomenon on the weight of the flash memory unit is compensated, and the accuracy of stored data can be improved.

Based on the same inventive concept, an embodiment of the present application also provides a flash memory chip calibration device, which can be used to implement the method described in the foregoing embodiment. Since the principle of the flash memory chip calibration device to solve the problem is similar to the above method, the implementation of the flash memory chip calibration device can refer to the implementation of the above method, and the repetition will not be repeated. As used below, the term "unit" or "module" can be a combination of software and/or hardware that implements a predetermined function. Although the devices described in the following embodiments are preferably implemented by software, implementation by hardware or a combination of software and hardware is also possible and conceived.

Figure 12:
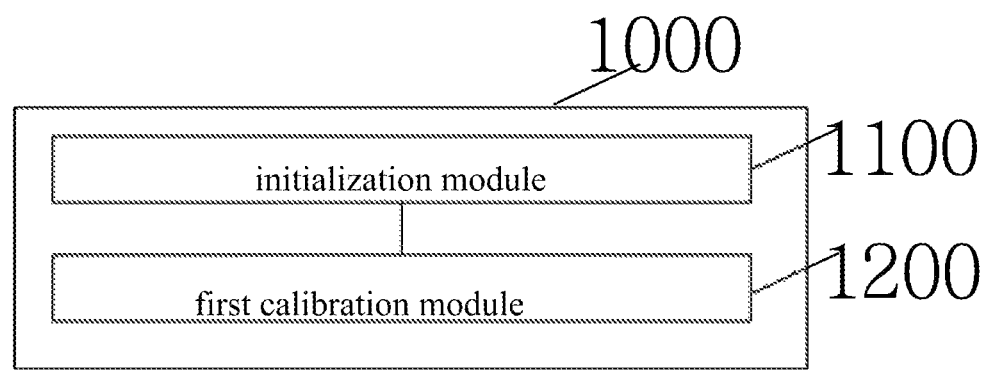
FIG. 12 shows a structural diagram of an apparatus for calibrating a flash memory chip according to an embodiment of the present disclosure.

FIG. 12 shows a structural diagram of an apparatus for calibrating a flash memory chip according to an embodiment of the present disclosure. As shown in FIG. 12, the flash memory chip calibration device 1000 is used for the above flash memory chip, and includes an initialization module 1100 and a first calibration module 1200.

The initialization module 1100 sets the initial weight value of the flash memory unit in the reference array according to the adjustable weight of the flash memory unit.

In an embodiment, the initialization module 1100 may include: an initial weight setting unit. The initial weight setting unit sets the initial weight value of each flash memory unit in N flash memory units of the reference array to be equal to one of the N-level adjustable weight, so that the initial weight value of the N flash memory units correspond one-to-one with the corresponding N-level adjustable weight.

The first calibration module 1200 calibrates the real-time weight value of the flash memory unit in the working array according to the real-time weight value and the initial weight value of the flash memory unit in the reference array.

In an embodiment, the first calibration module may include: an acquisition unit, a reading unit, and a calibration unit. The obtaining unit is used to obtain the calibration target weight value of the flash memory unit in the reference array according to the real-time weight value thereof. Specifically: Firstly, reading the real-time weight value of the flash memory unit in the reference array. When the number of the reference array is 1, the read real-time weight value of the flash memory unit is used as the calibration target weight value of the flash memory unit. When the number of the reference array is greater than 1, the average value of the real-time weight values of the flash memory units with the same initial weight value in all the reference arrays is calculated as the calibration target weight value of the flash memory unit.

The reading unit is used to sequentially read the real-time weight values of the flash memory units in the working array.

The calibration unit is used to sequentially calibrate the real-time weight values of the flash memory units in the working array according to the initial weight values of the N flash memory units in the reference array and the calibration target weight values. Specifically: Firstly, searching the reference array for a flash memory unit whose calibration target weight value is equal to or similar to a real-time weight value of a flash memory unit in the working array. Then, the real-time weight value of the flash memory unit in the working array is set to the initial weight value of the flash memory unit in the found reference array.

Figure 13:
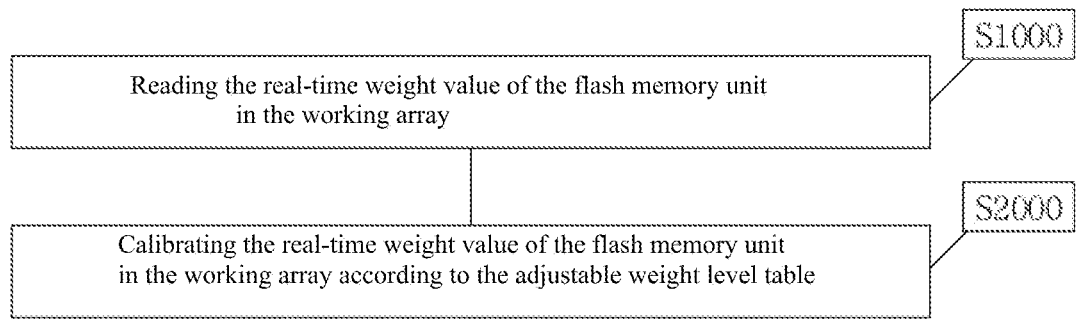
FIG. 13 shows a flowchart of another method for calibrating a flash memory chip according to the present disclosure.

The embodiment of the present disclosure also provides a flash memory chip calibration method, as shown in FIG. 13, which is used for the above flash memory chip, and the flash memory chip calibration method includes:

Step S1000: Reading the real-time weight value of the flash memory unit in the working array.

the working array of the flash memory chip is composed of a plurality of flash memory units with an adjustable weight level of N, that is, the flash memory units have N levels of adjustable weight. In addition, the flash memory chip further includes a reading circuit for reading the weight values of the flash memory units in the working array; a programming circuit for controlling the weight value of the flash memory units in the working array; a row and column decoders for selecting the flash memory units in the working array; and a controller for controlling the operation of the reading circuit, the programming circuit and the row and column decoder.

Specifically, the controller controls the read circuit to cooperate with the row and column decoder to read the real-time weight value of each flash memory unit in the working array.

Step S2000: Calibrating the real-time weight value of the flash memory unit in the working array according to the adjustable weight level table.

Specifically, for a certain flash memory unit, an adjustable weight value that is equal to or similar to the real-time weight value of the flash memory unit is searched in the adjustable weight level table. Then, the controller controls the programming circuit to cooperate with the row and column decoder to set the real-time weight value of the flash memory unit to the found adjustable weight value.

It is should be noted that when the real-time weight value of the flash memory unit is located between two adjacent adjustable weight values, the flash memory unit is calibrated by the adjustable weight value that is closer to the real-time weight value of the flash memory unit. When the real-time weight value of the flash memory unit is exactly in the middle of two adjacent adjustable weight values, the adjustable weight value of the two adjustable weight values that is greater than the real-time weight value can be used to calibrate the flash memory unit. Alternatively, the flash memory unit may be calibrated using an adjustable weight value smaller than the real-time weight value among the two adjustable weight values.

Of course, in the same flash memory chip, when the real-time weight value of the flash memory unit is exactly in the middle of two adjacent adjustable weight values, if the flash memory unit is calibrated with the adjustable weight value of the two adjustable weight values that is greater than the real-time weight value, this method is used for all flash memory units of the flash memory chip, and vice versa.

In summary, the flash memory chip calibration method provided by the embodiment of the present disclosure directly uses the adjustable weight level of the flash memory unit to calibrate the working array in the flash memory chip. The off-line updating calibration of the weight of the flash memory unit in the working array is realized, which compensates the influence of the leakage phenomenon on the weight of the flash memory unit, and can improve the accuracy of the stored data.

Based on the same inventive concept, an embodiment of the present application also provides a flash memory chip calibration device, which can be used to implement the method described in the foregoing embodiment. Since the principle of the flash memory chip calibration device to solve the problem is similar to the above method, the implementation of the flash memory chip calibration device can refer to the implementation of the above method, and the repetition will not be repeated. As used below, the term "unit" or "module" can be a combination of software and/or hardware that implements a predetermined function. Although the devices described in the following embodiments are preferably implemented by software, implementation by hardware or a combination of software and hardware is also possible and conceived.

Figure 14:
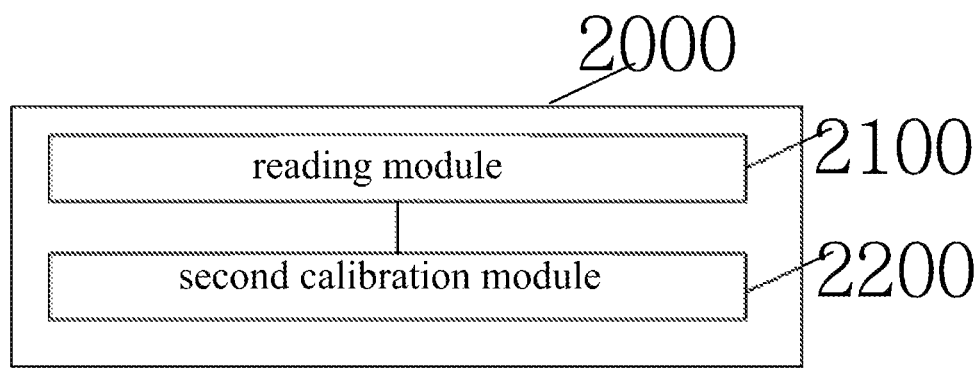
FIG. 14 shows a structural diagram of a flash memory chip calibration device according to another embodiment of the present disclosure.

FIG. 14 shows a structural diagram of a flash memory chip calibration device according to another embodiment of the present disclosure. As shown in FIG. 14, the flash memory chip calibration device 2000 includes a reading module 2100 and a second calibration module 2200.

The reading module 2100 reads the real-time weight value of the flash memory units in the working array.

The second calibration module 2200 calibrates the real-time weight value of the flash memory unit in the working array according to the adjustable weight level table.

Specifically, the second calibration module 2200 includes: a search unit and an adjustment unit. The search unit is used to search for an adjustable weight value that is equal to or similar to the real-time weight value of the flash memory unit in the adjustable weight level table. The adjustment unit is used to set the real-time weight value of the flash memory unit to the adjustable weight value.

The devices, modules, or units illustrated in the above embodiments may be specifically implemented by chips or implemented by products with certain functions. A typical implementation device is a computer device. Specifically, the computer device may be, for example, a personal computer, a laptop computer, a cellular phone, a camera phone, a smart phone, a personal digital assistants, a media player, a navigation device, an email device, a game console, a tablet computer, a wearable devices, or any combination of these devices.

In a typical example, the computer device specifically includes a memory, a processor, and a computer program that is stored in the memory and can run on the processor, and the processor implements the method for calibrating a flash memory chip as described above when the program is executed.

Figure 15:
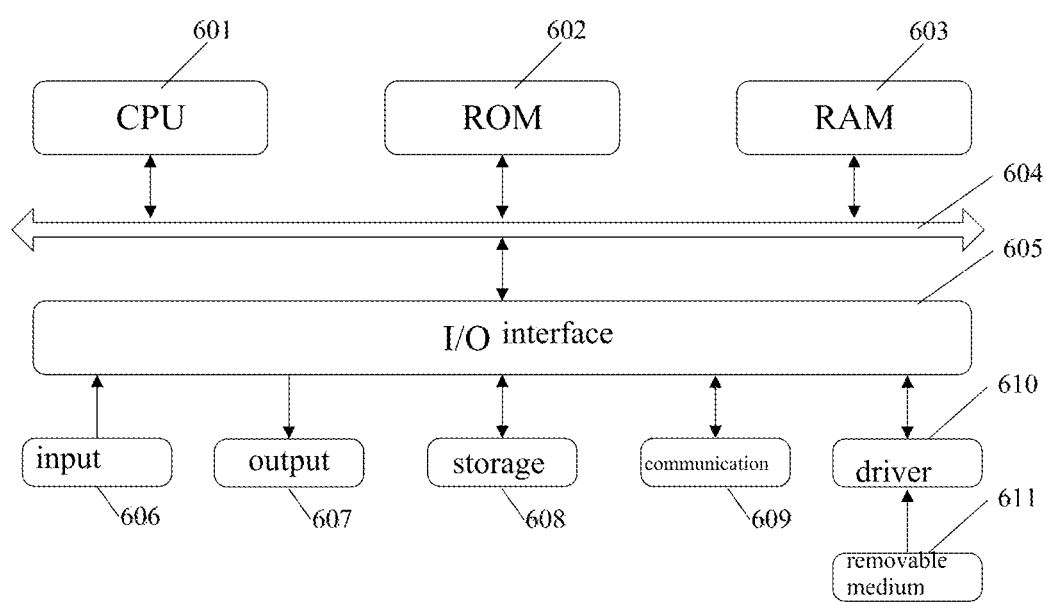
FIG. 15 shows a schematic structural diagram of a computer device suitable for implementing the embodiments of the present application.

Now referring to FIG. 15, which shows a schematic structural diagram of a computer device suitable for implementing the embodiments of the present application.

As shown in FIG. 15, the computer device includes a central processing unit (CPU) 601, which can be based on a program stored in a read-only memory (ROM) 602 or a program loaded from a storage part 608 to a random access memory (RAM)) 603 and performing all kinds of appropriate work and processing. In the RAM 603, various programs and data required for the operation of the system 600 are also stored. The CPU 601, the ROM 602, and the RAM 603 are connected to each other through a bus 604. An input/output (I/O) interface 605 is also connected to the bus 604.

The following components are connected to the I/O interface 605: an input part 606 including a keyboard, a mouse, etc.; an output part 607 including a cathode ray tube (CRT), a liquid crystal display (LCD), etc., and speakers, etc.; a storage part 608 including a hard disk, etc.; and the communication part 609 including a network interface card such as a LAN card, a modem, etc. The communication section 609 performs communication processing via a network such as the Internet. The driver 610 is also connected to the I/O interface 606 as needed. The removable medium 611, such as a magnetic disk, an optical disk, a magneto-optical disk, a semiconductor memory, etc., is installed on the drive 610 as required, so that the computer program read from it is installed as the storage part 608 as required.

In particular, according to an embodiment of the present disclosure, the process described above with reference to the flowchart can be implemented as a computer software program. For example, an embodiment of the present disclosure also provides a computer-readable medium, a computer program is tangibly contained on the computer-readable medium, and the computer program includes program code for executing the method shown in the flowchart. When the computer program is executed by the processor, the steps of the above flash memory chip calibration method are realized. In such an embodiment, the computer program may be downloaded and installed from the network through the communication part 609, and/or installed from the removable medium 611.

Computer-readable media include permanent and non-permanent, removable and non-removable media, and information storage can be realized by any method or technology. The information can be computer-readable instructions, data structures, program modules, or other data. Examples of computer storage media include, but are not limited to, phase change memory (PRAM), static random access memory (SRAM), dynamic random access memory (DRAM), other types of random access memory (RAM), read-only memory (ROM), electrically erasable programmable read-only memory (EEPROM), flash memory or other memory technology, CD-ROM, digital versatile disc (DVD) or other optical storage, magnetic cassettes, magnetic tape magnetic disk storage or other magnetic storage devices or any other non-transmission media can be used to store information that can be accessed by computing devices. According to the definition in this article, computer-readable media does not include transitory media, such as modulated data signals and carrier waves.

The controller in this application can take the form of, for example, a microprocessor or processor, and a computer-readable medium storing computer-readable program codes (such as software or firmware) that can be executed by the (micro) processor, logic gates, switches, and dedicated integrated circuits. Circuit (Application Specific Integrated Circuit, ASIC), programmable logic controller and embedded microcontroller form. Examples of controllers include but are not limited to the following microcontrollers: ARC 625D, Atmel AT91SAM, Microchip PIC18F26K20, and Silicon Labs C8051F320. Those skilled in the art also know that in addition to implementing the controller in a purely computer-readable program code manner, the controller can be implemented in the form of logic gates, switches, application specific integrated circuits, programmable logic controllers, and embedded microcontrollers. Therefore, such a controller can be regarded as a hardware component, and the devices included in the controller for realizing various functions can also be regarded as a structure within the hardware component.

For the convenience of description, when describing the above device, the functions are divided into various units and described separately. Of course, when implementing this application, the functions of each unit can be implemented in the same or multiple software and/or hardware.

The present disclosure is described with reference to flowcharts and/or block diagrams of methods, devices (systems), and computer program products according to embodiments of the present disclosure. It should be understood that each process and/or block in the flowchart and/or block diagram, and the combination of processes and/or blocks in the flowchart and/or block diagram can be realized by computer program instructions. These computer program instructions can be provided to the processor of a general-purpose computer, a special-purpose computer, an embedded processor, or other programmable data processing equipment to produce a machine. The instructions executed by the processor of the computer or other programmable data processing equipment are caused to generate means for implementing the functions specified in one or more processes in the flowchart and/or one or more blocks in the block diagram.

These computer program instructions can also be stored in a computer-readable memory that can guide a computer or other programmable data processing equipment to work in a specific manner. The instructions stored in the computer-readable memory are caused to produce an article of manufacture including an instruction device, which implements the function specified in one process or multiple processes in the flowchart and/or one block or multiple blocks in the block diagram.

These computer program instructions can also be loaded onto a computer or other programmable data processing equipment. Makes a series of operation steps executed on a computer or other programmable equipment to produce computer-implemented processing. Thereby, the instructions executed on the computer or other programmable devices provide steps for implementing the functions specified in one or more processes in the flowchart and/or one block or more in the block diagram.

It should also be noted that the terms "include", "comprise" or any other variants thereof are intended to cover non-exclusive inclusion. Thus, a process, method, product, or equipment that includes a series of elements includes not only those elements. It also includes other elements that are not explicitly listed, or elements inherent to the process, method, commodity, or equipment. If there are no more restrictions, the element defined by the sentence "including a . . . " does not exclude the existence of other identical elements in the process, method, commodity, or equipment that includes the element.

Those skilled in the art should understand that the embodiments of the present application can be provided as a method, a system, or a computer program product. Therefore, this application may adopt the form of a complete hardware embodiment, a complete software embodiment, or an embodiment combining software and hardware. Moreover, this application may adopt the form of a computer program product implemented on one or more computer-usable storage media (including but not limited to disk storage, CD-ROM, optical storage, etc.) containing computer-usable program codes.

This application may be described in the general context of computer-executable instructions executed by a computer, such as a program module. Generally, program modules include routines, programs, objects, components, data structures, etc. that perform specific tasks or implement specific abstract data types. This application can also be practiced in distributed computing environments. In these distributed computing environments, tasks are performed by remote processing devices connected through a communication network. In a distributed computing environment, program modules can be located in local and remote computer storage media including storage devices.

The various embodiments in this specification are described in a progressive manner, and the same or similar parts between the various embodiments can be referred to each other, and each embodiment focuses on the differences from other embodiments. In particular, as for the system embodiment, since it is basically similar to the method embodiment, the description is relatively simple, and for related parts, please refer to the part of the description of the method embodiment.

Although this application provides method operation steps as described in the embodiments or flowcharts, conventional or uninvented labor may include more or fewer operation steps. The sequence of steps listed in the embodiments is only one way of the execution order of the steps, and does not represent the only execution order. When the actual device or client product is executed, it may be executed sequentially or in parallel according to the methods shown in the embodiments or the drawings (for example, a parallel processor or a multi-threaded processing environment).

The above descriptions are only examples of this application, and are not intended to limit this application. For those skilled in the art, this application can have various modifications and changes. Any modification, equivalent replacement, improvement, etc. made within the spirit and principle of this application shall be included in the scope of the claims of this application.

What is claimed is:

1. A method for calibrating a flash memory chip, which comprising: a working array and at least one reference array for calibrating said working array;
    both said working array and said reference array are composed of a plurality of flash memory units with an adjustable weight level of N, and said flash memory units have N levels of adjustable weight;
    the number of flash memory units in said reference array is greater than or equal to said adjustable weight level N;
    the initial weight values of the N flash memory units of the reference array correspond one-to-one with the N-level adjustable weights;
    wherein the method comprising:
    setting the initial weight value of the flash memory unit in the reference array according to the adjustable weight of the flash memory unit;
    calibrating the real-time weight value of the flash memory unit in the working array according to the real-time weight value and the initial weight value of the flash memory unit in the reference array.

2. The method according to claim 1, wherein said step of setting the initial weight value of the flash memory unit in the reference array according to the adjustable weight of the flash memory unit further comprising:
    setting the initial weight value of each flash memory unit in N flash memory units of the reference array to be equal to the one of said N-level adjustable weight, so that the initial weight value of the N flash memory units corresponds one-to-one with a N-level adjustable weight.

3. The method according to claim 2, wherein said step of calibrating the real-time weight value of the flash memory unit in the working array according to the real-time weight value and the initial weight value of the flash memory unit in the reference array further comprising:
    obtaining the calibration target weight value according to the real-time weight value of the flash memory unit in the reference array;
    reading the real-time weight values of the flash memory units in the working array sequentially;
    calibrating the real-time weight values of the flash memory units in the working array sequentially according to the initial weight values of the N flash memory units in the reference array and the calibration target weight values.

4. The method according to claim 3, wherein said step of calibrating the real-time weight values of the flash memory units in the working array sequentially according to the initial weight values of the N flash memory units in the reference array and the calibration target weight values further comprising:
    searching the reference array for a flash memory unit whose calibration target weight value is equal to or similar to a real-time weight value of a flash memory unit in the working array;
    setting the real-time weight value of the flash memory unit in the working array to an initial weight value of the found flash memory unit in the reference array.

5. The method according to claim 3, wherein said step of obtaining the calibration target weight value according to the real-time weight value of the flash memory unit in the reference array further comprising:
    reading the real-time weight value of the flash memory unit in the reference array;
    using the read real-time weight value of the flash memory unit as the calibration target weight value of the flash memory unit, when the number of the reference array is 1;
    calculating the average value of the real-time weight values of the flash memory units with the same initial weight value in all the reference arrays as the calibration target weight value of the flash memory unit, when the number of the reference array is greater than 1.

6. A flash memory chip calibration device for used in a flash memory chip, which comprising: a working array and at least one reference array for calibrating said working array;
    both said working array and said reference array are composed of a plurality of flash memory units with an adjustable weight level of N, and said flash memory units have N levels of adjustable weight;
    the number of flash memory units in said reference array is greater than or equal to said adjustable weight level N;

the initial weight values of the N flash memory units of the reference array correspond one-to-one with the N-level adjustable weights;

said flash memory chip calibration device comprising:

an initialization module, which setting the initial weight value of the flash memory unit in the reference array according to the adjustable weight of the flash memory unit;

a first calibration module, which calibrating the real-time weight value of the flash memory unit in the working array according to the real-time weight value and the initial weight value of the flash memory unit in the reference array.

7. The flash memory chip calibration device according to claim 6, wherein said initialization module further comprising:

an initial weight setting unit, which setting the initial weight value of each flash memory unit in N flash memory units of the reference array to be equal to one of the N-level adjustable weight, so that the initial weight value of the N flash memory units corresponds one-to-one with a N-level adjustable weight.

8. The flash memory chip calibration device according to claim 6, wherein said first calibration module further comprising:

an obtaining unit, which obtaining the calibration target weight value according to the real-time weight value of the flash memory unit in the reference array;

a reading unit, which reading the real-time weight values of the flash memory units in the working array sequentially a calibration unit, which calibrating the real-time weight values of the flash memory units in the working array sequentially according to the initial weight values of the N flash memory units in the reference array and the calibration target weight values.

9. The method according to claim 1, wherein said flash memory chip further comprising: a reading circuit, said reading circuit is connected to said working array and said reference array, and is used to read the weight values of said flash memory units in said working array and said reference array.

10. The method according to claim 9, wherein said flash memory chip further comprising: a programming circuit, said programming circuit is connected to said working array and said reference array, and is used to control the weight values of said flash memory units in said working array and said reference array.

11. The method according to claim 9, wherein said flash memory chip further comprising: a row and column decoder, said row and column decoder is connected to said working array and said reference array, and is used to select said flash memory units in said working array and said reference array.

12. The method according to claim 11, wherein said flash memory chip further comprising: a controller, said controller is connected to said reading circuit, said programming circuit and said row and column decoder, and is used for controlling the operation of said reading circuit, said programming circuit and said row and column decoder.

13. The flash memory chip calibration device according to claim 6, wherein said flash memory chip further comprising: a reading circuit, said reading circuit is connected to said working array and said reference array, and is used to read the weight values of said flash memory units in said working array and said reference array.

14. The flash memory chip calibration device according to claim 13, wherein said flash memory chip further comprising: a programming circuit, said programming circuit is connected to said working array and said reference array, and is used to control the weight values of said flash memory units in said working array and said reference array.

15. The flash memory chip calibration device according to claim 13, wherein said flash memory chip further comprising: a row and column decoder, said row and column decoder is connected to said working array and said reference array, and is used to select said flash memory units in said working array and said reference array.

16. The flash memory chip calibration device according to claim 15, wherein said flash memory chip further comprising: a controller, said controller is connected to said reading circuit, said programming circuit and said row and column decoder, and is used for controlling the operation of said reading circuit, said programming circuit and said row and column decoder.

* * * * *